United States Patent
Prosack et al.

(10) Patent No.: US 6,556,876 B1
(45) Date of Patent: Apr. 29, 2003

(54) HYBRID FUZZY CLOSED-LOOP SUB-MICRON CRITICAL DIMENSION CONTROL IN WAFER MANUFACTURING

(75) Inventors: Hank Prosack, Scarborough, ME (US); Patrick H. Ferland, Portland, ME (US); Kenneth Swan, Gorham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 232 days.

(21) Appl. No.: 09/689,008

(22) Filed: Oct. 12, 2000

(51) Int. Cl.[7] .............................................. G05B 19/18
(52) U.S. Cl. .............................. 700/50; 700/45; 700/52; 706/2
(58) Field of Search ...................... 700/50, 121, 45–46, 700/51–52; 706/47, 52, 900, 2

(56) References Cited

U.S. PATENT DOCUMENTS

| | | | |
|---|---|---|---|
| 5,283,575 A | * 2/1994 | Koa et al. .................... 340/990 |
| 5,497,331 A | * 3/1996 | Iriki et al. ................... 700/121 |
| 5,544,256 A | 8/1996 | Breecher et al. ............. 382/149 |
| 5,767,785 A | * 6/1998 | Goldberg ............... 340/825.44 |
| 5,822,740 A | * 10/1998 | Haissig et al. .................. 706/3 |
| 6,101,444 A | * 8/2000 | Stoner .......................... 702/9 |
| 6,125,976 A1 | * 7/2001 | Lemelson et al. ............. 701/3 |
| 6,282,526 B1 | * 8/2002 | Ganesh .......................... 706/8 |

OTHER PUBLICATIONS

1942 –G. J. Meyers, Jr. Why the Control Chart Works; Some Examples. Statistical Quality Control, Sixth Edition.
1956—Wester Electric Company, Introduction to Statistical Quality Control and Introduction to Control Charts. Statistical Quality Control Handbook.
1997—J.-S.R. Jang et al., Introduction to Neuro–Fuzzy and Soft Computing Chapters 1–4. Neuro–Fuzzy and Soft Computing. A Computational Approach to Learning and Machine Intellegence.

* cited by examiner

*Primary Examiner*—John Follansbee
*Assistant Examiner*—Ronald D Hartman, Jr.
(74) *Attorney, Agent, or Firm*—Stallman & Pollock LLP

(57) ABSTRACT

Variation in results of a semiconductor fabrication process is minimized by adjusting process parameters utilizing a fuzzy-controlled learning feedback system. The fuzzy-controlled learning system receives as inputs the results of the fabrication process and then converts these results into a fuzzy set defined by a membership function. An inference engine applies a fuzzy rule base to map an output fuzzy set from the input fuzzy set. The fuzzy output set is then converted to crisp outputs which automatically adjusts parameters of the fabrication process in order to minimize variation.

2 Claims, 13 Drawing Sheets

HYBRID FUZZY CLOSED-LOOP SUB-MICRON CRITICAL DIMENSION CONTROL IN WAFER MANUFACTURING

BACKGROUND OF THE INVENTION

1. Field of the Invention

The present invention relates to a method of controlling a semiconductor fabrication process and, in particular, to a method of controlling variation in a semiconductor fabrication process utilizing a fuzzy-controlled learning feedback system.

2. Description of the Related Art

Fabrication of integrated circuits is an extremely complex process requiring the performance of carefully coordinated photolithography, etching and doping steps. Because these steps are performed in succession, process deviation from desired targets has a cumulative effect and, thus, must be carefully monitored to ensure that the final product operates within specified tolerances.

FIG. 1 depicts a conventional method for controlling process variation utilizing statistical process control (SPC). Statistical process control is a methodology for characterizing, interpreting and minimizing variation in the results of a process. Statistical process control is described extensively by Grant et al., *Statistical Quality Control*, 6th Ed. (1988), hereby incorporated by reference. A well-established set of rules for determining process variation requiring correction is set forth in the statistical Quality Control Handbook of the Western Electric Company (1956), also hereby incorporated by reference.

As shown in FIG. 1, results 100 of a given semiconductor fabrication process are received and plotted on chart 102. Chart 102 includes a target mean 104 for the plotted parameter. Chart 102 also includes a series of dashed lines indicating positive incremental deviations from target mean 104, designated as $+\Phi_1$, $+\Phi_2$, and $+\Phi_3$, and a series of dashed lines indicating negative incremental deviations from target mean 104, designated as $-\Phi_1$, $-\Phi_2$, and $-\Phi_3$.

Once the process results 100 have been plotted on chart 102, the quantity and quality of this process variation is characterized according to rules dictated by statistical process control (SPC) analysis.

Based upon the process variation characterized by chart 102, the engineer supervising the fabrication process must interpret this variation and then manually adjust process parameters in such a way as to minimize future variation.

While satisfactory for some applications, the conventional method of process control suffers from a number of disadvantages.

One disadvantage of the conventional method shown in FIG. 1 is its labor intensity. Human intervention is required to compile and characterize the process variation, as well as to interpret this process variation and to adjust process parameters to reduce or eliminate variation. Therefore, there is a need in the art for a method of controlling a semiconductor fabrication process requiring as little human intervention as possible.

Another disadvantage of the conventional process is inherent delay in responding to process variation. Because a human operator must first characterize and interpret process variation before an adjustment is made, the inherent delay can result in the loss of product in the intervening time which has experienced unacceptable variation. Therefore, there is a need in the art for a method of controlling a semiconductor fabrication process which provides rapid recognition of process variation and corresponding adjustment of process parameters.

Yet another disadvantage of the conventional process is the inherent variability in process control that is introduced by manual interpretation of process variation. While the SPC rules described above aid somewhat in recognizing process variation, the decision of whether or not to adjust process parameters is influenced by such non-easily quantifiable factors as the operator's experience and discretion. Thus, the ultimate decision regarding whether or not to modify the process parameters based upon a given type of variation is not automatically reproducible. This manual form of decision-making can, in turn, lead to non-uniform process control. Therefore, there is a need in the art for a method of controlling a semiconductor fabrication process which provides reproducible modification of process parameters given a specific process variation.

In summary, there is a need in the art for a method of process control which responds quickly to deviation to ensure a minimum amount of wasted material.

SUMMARY OF THE INVENTION

The present invention relates to a method of controlling variation in a semiconductor fabrication process utilizing a fuzzy-controlled learning system. The fuzzy-controlled learning system receives as inputs variation in the results of a semiconductor process flow. Utilizing a fuzzy rule base, an inference engine of the fuzzy system generates fuzzy output sets which dictate the parameters of the semiconductor fabrication process. Automatic feedback of the output of the fuzzy-controlled learning system keeps process variation low with a minimum of manual human intervention.

The features and advantages of the present invention will be understood upon consideration of the following detailed description of the invention and the accompanying drawings.

DETAILED DESCRIPTION

The present invention relates to utilization of intelligent, automatic control over variation in a semiconductor fabrication process. Specifically, the present invention utilizes fuzzy logic principles to characterize and interpret process variation, with automatic feedback and adjustment of process parameters designed to minimize such process variation. A detailed description of one embodiment for controlling semiconductor process variation in accordance with the invention is provided below.

FIGS. 2A–2G show cross-sectional views of a semiconductor fabrication process amenable to control utilizing the method of the present invention. The semiconductor fabrication process of FIGS. 2A–2G involves etching a layer of polysilicon to define a polysilicon gate structure of a MOS transistor.

Figure 1:
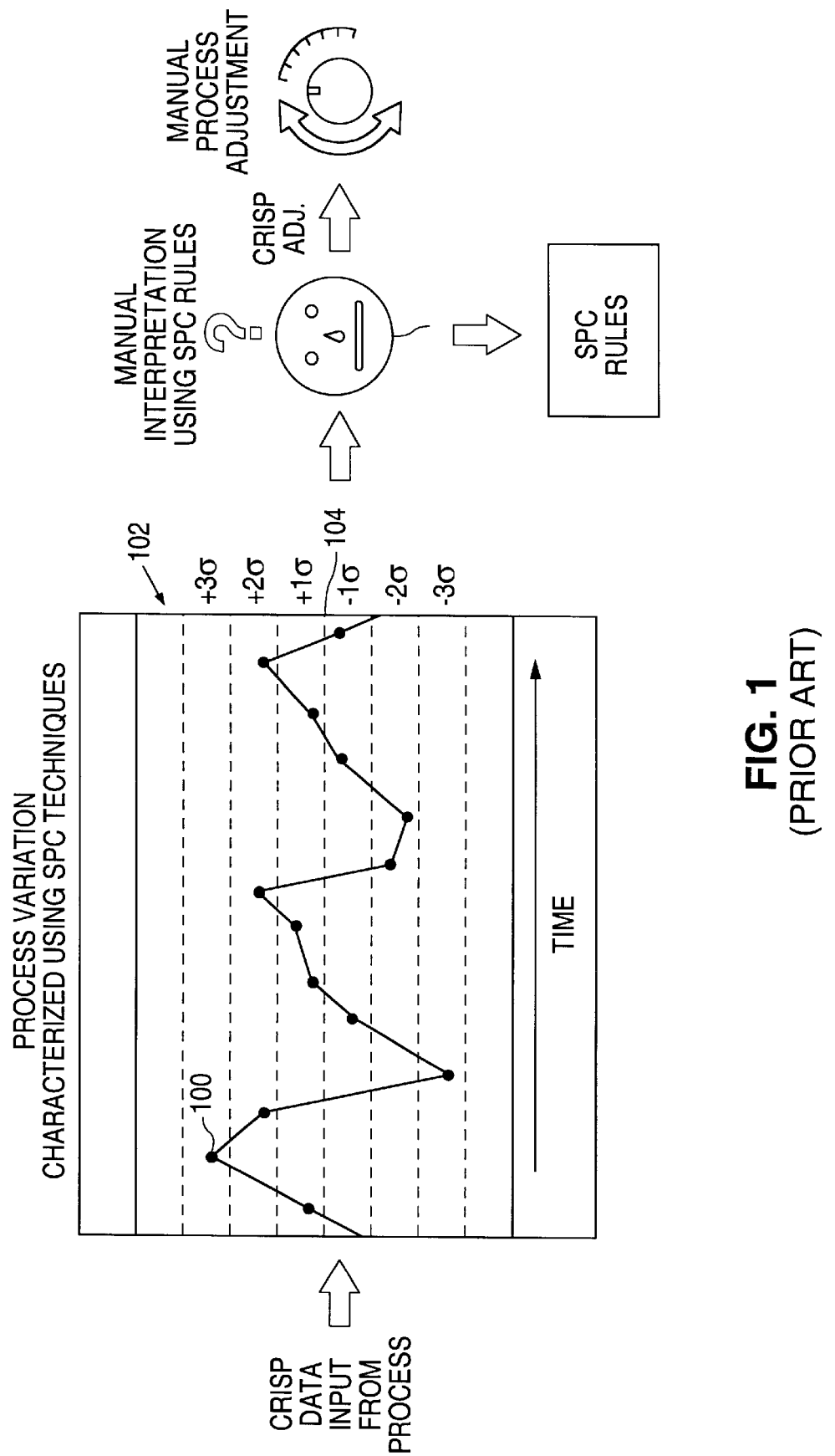
FIG. 1 depicts a conventional method of controlling process variation utilizing a statistical process control approach.
Figure 2A:
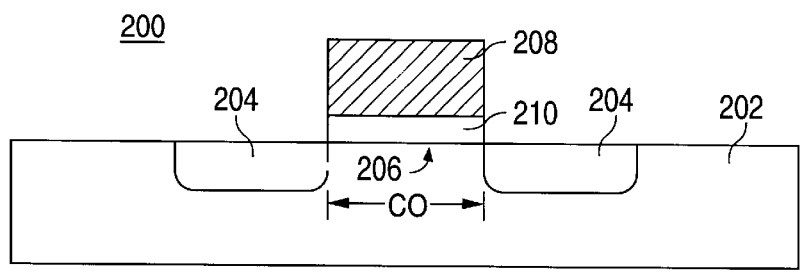
FIGS. 2A–2G are cross-sectional views illustrating a polysilicon etching sequence experiencing process variation.

FIG. 2A shows a cross-sectional view of a MOS transistor device 200. MOS device 200 is formed in single crystal silicon 202 and includes doped source and drain regions 204 separated by intervening channel region 206. Polysilicon gate 208 overlies and is separated from channel region 206 by gate dielectric 210. The width of channel region 206 plays a significant role in determining the functionality of MOS transistor device 200. For this reason, the width of channel region 206 is known as the critical dimension ("CD") for the process.

FIGS. 2B–2G show the process steps for forming polysilicon gate 208 of MOS device 200.

Figure 2B:
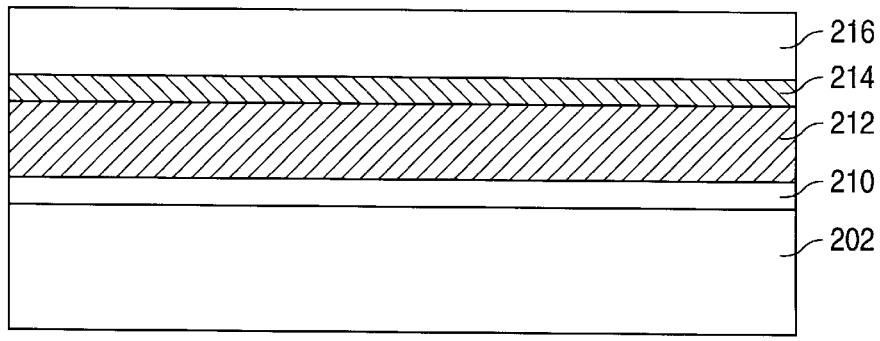

In FIG. 2B, gate dielectric layer 210 is formed over single crystal silicon 202 and polysilicon layer 212 is formed over gate dielectric layer 210. Next, bottom anti-reflective coating (BARC) layer 214 is formed over polysilicon 212. Finally, undeveloped photoresist 216 is formed over BARC 214.

Figure 2C:
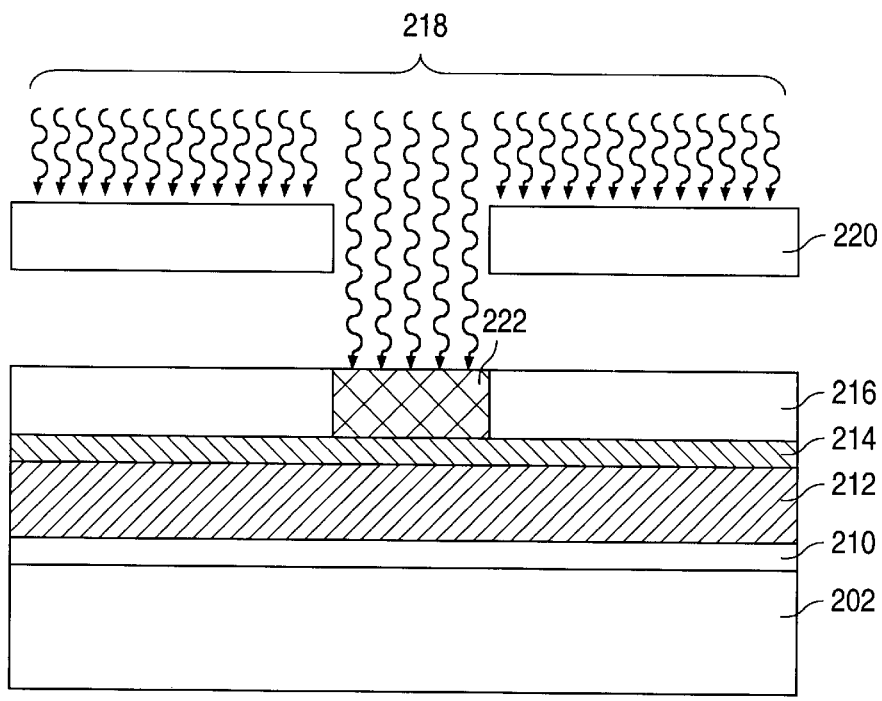

FIG. 2C shows an exposure step, wherein undeveloped photoresist 216 is exposed to incident radiation 218 through overlying reticle 220. Reticle 220 blocks incident radiation 218 from reaching selected regions of undeveloped photoresist 216. In regions exposed to incident radiation 218, the photoresist is altered in structure to become developed photoresist 222. In regions blocked from receiving incident radiation 218 by reticle 220, undeveloped photoresist 216 retains its original structure. During the exposure step shown in FIG. 2C, BARC layer 214 allows precise application of incident radiation 218 by eliminating reflection and defining the depth-of-field.

Figure 2D:
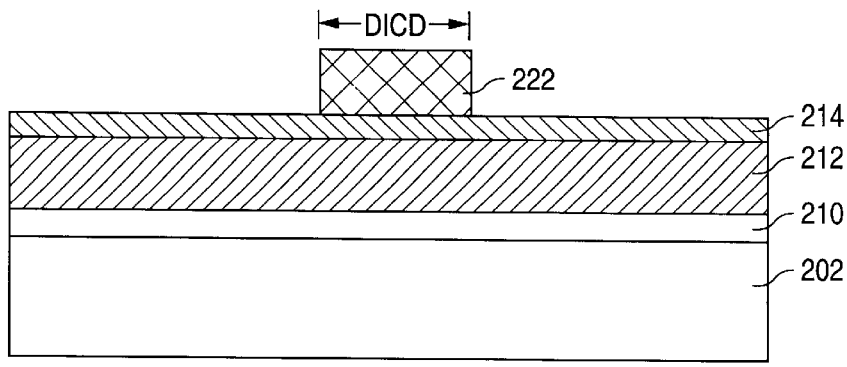

FIG. 2D shows the subsequent development step, wherein the incident radiation is removed and the photoresist 216 is then contacted with a solvent in which undeveloped photoresist 222 is soluble, but developed photoresist 216 is insoluble, such that the undeveloped photoresist is removed. The develop inspect critical dimension ("DICD") resulting from this development step represents the critical dimension following photoresist development, but prior to etching.

At this point in the process, the wafer is typically transferred from the photolithography department of the fabrication facility to the etching department. Subsequent etching of polysilicon layer 212 in regions unprotected by developed photoresist 222 ultimately defines the width of the polysilicon gate 208.

Figure 2E:
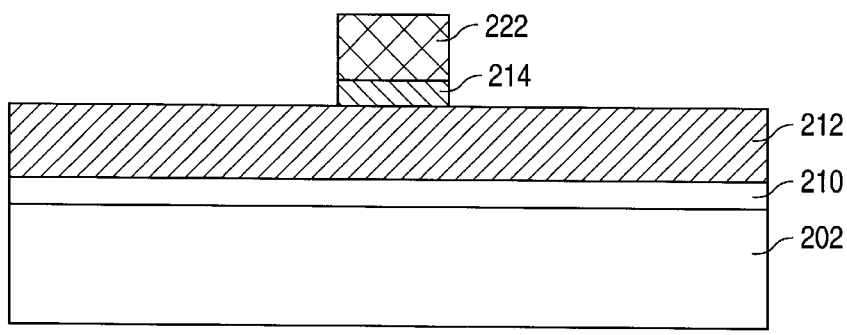

Etching to form the gate 208 actually takes place in two discrete steps. As shown in FIG. 2E, exposed BARC 214 (an organic film) is first removed by $O_2$ plasma etching.

Figure 2F:
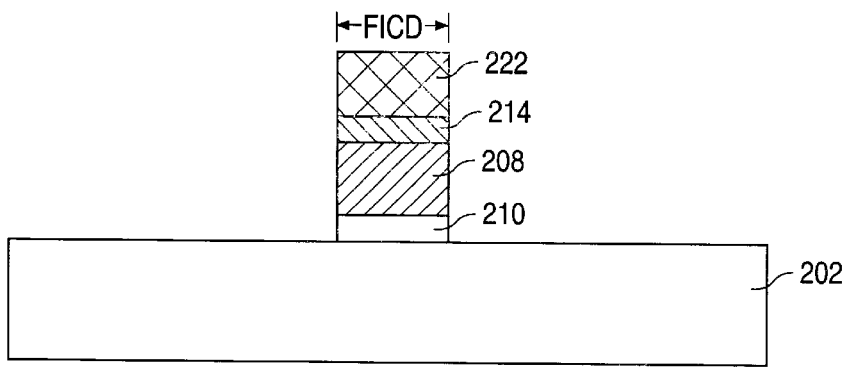
Figure 2G:
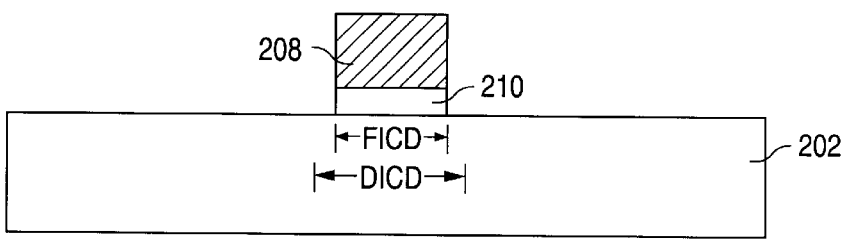

Following removal of BARC 214, FIG. 2F shows removal of the underlying polysilicon 212 by conventional etching. At the conclusion of the conventional plasma etching, polysilicon gate 208 has assumed its final dimensions. The critical dimension at this step in the process is thus characterized as the final inspect critical dimension ("FICD").

As is evident from comparing FIGS. 2D and 2E, the FICD is generally narrower than the DICD. Specifically, $O_2$ plasma etching to remove the organic BARC in FIG. 2E also causes removal of some developed photoresist 222. As a result, in FIG. 2E, the edges of developed photoresist mask 222 have receded, and a correspondingly larger portion of underlying polysilicon layer 212 is exposed to plasma etching and removed in FIG. 2F.

The polysilicon etch sequence illustrated above in conjunction with FIGS. 2A–2G represents a fabrication process requiring control and optimization. Specifically, the development step anticipates expected overetching of polysilicon during subsequent BARC removal, and thus the DICD is designed to be larger than the FICD. Therefore, the conditions under which the BARC is etched (hereafter described as "etch bias") must be carefully controlled to overetch the BARC only as much as necessary to produce the desired FICD from an initial given DICD.

Figure 3:
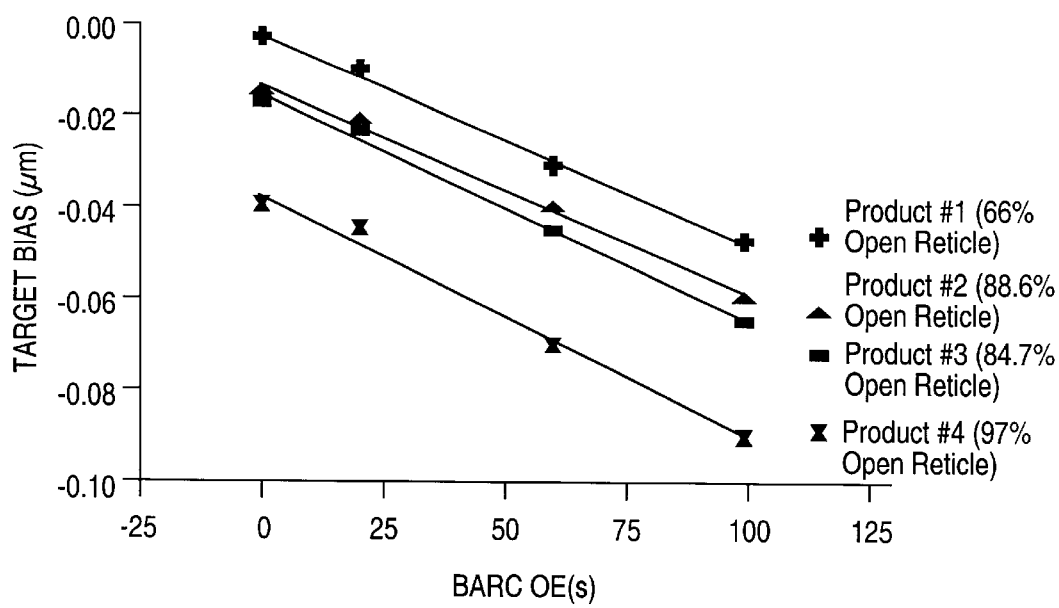
FIG. 3 is a graph that plots TARGET BIAS versus BARC overetching for integrated circuits exhibiting a variety of open reticle areas.

FIG. 3 plots target bias versus BARC overetching (BARC OE). FIG. 3 reveals a linear relationship between etch bias and BARC OE. FIG. 3 also reveals that the precise relationship between etch bias and BARC OE depends upon the product to be formed. Where the product includes a low density of semiconductor circuit features and, hence, a large percentage of reticle open area, a relatively small amount of developed photoresist remains on the wafer after development and during BARC removal. Given a fixed density of plasma during the BARC etching step, relatively large amounts of developed photoresist are removed by the same etch bias, yielding a more negative etch bias.

By contrast, where the product includes a high density of semiconductor circuit features and, hence, a low percentage of reticle open area, a larger amount of developed photoresist remains on the wafer after development and during BARC removal. This is because as the density of the etching plasma remains the same, smaller amounts of developed photoresist are removed by the same etch bias, yielding a less negative etch bias.

Figure 4:
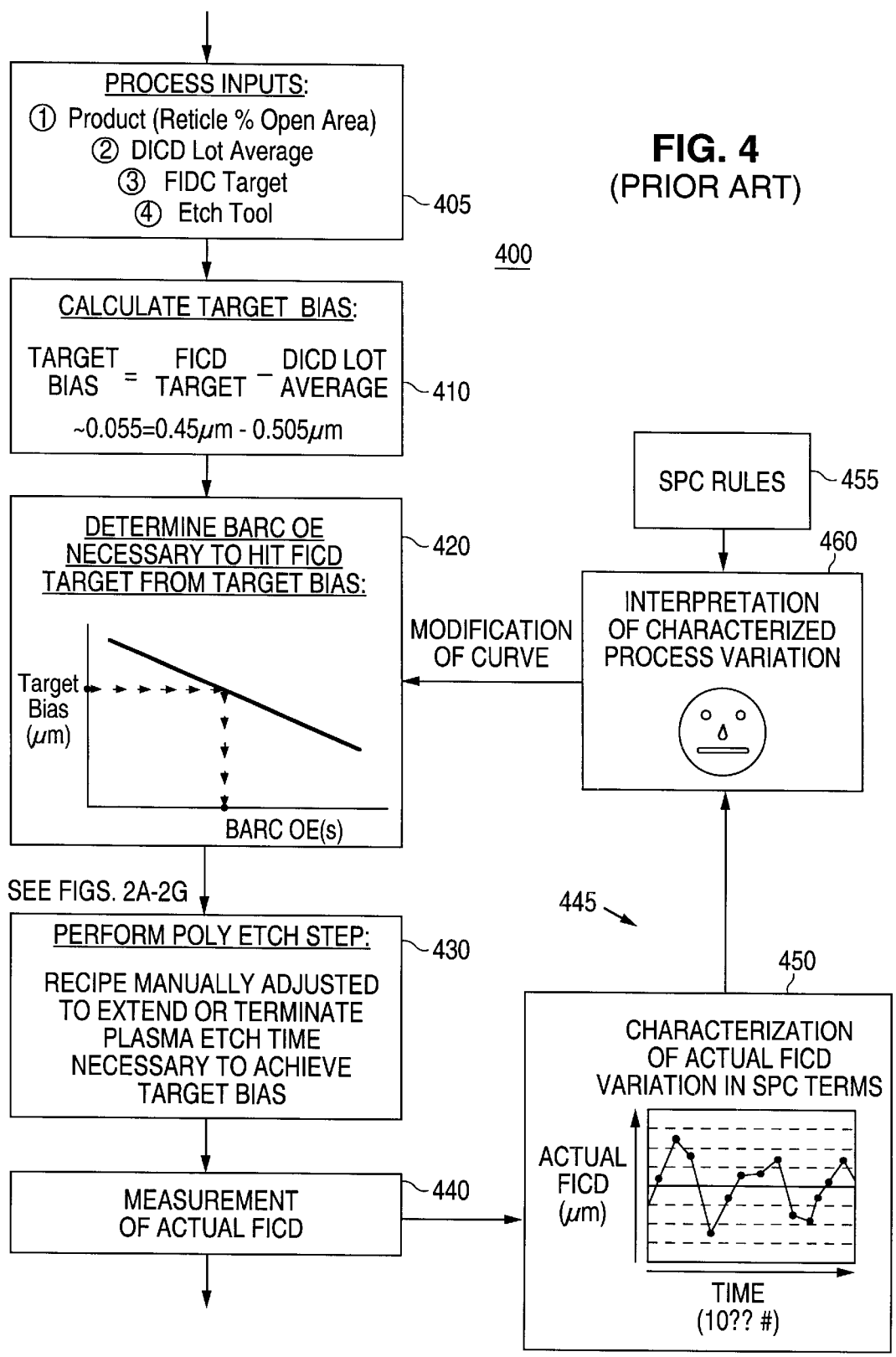
FIG. 4 is a flow chart illustrating the conventional method of controlling variation in the polysilicon etch sequence shown in FIGS. 2A–2G.

FIG. 4 is a flow chart representing the conventional method for controlling variation in the polysilicon etch sequence shown in FIGS. 2A–2G.

As a first step 405, method 400 receives a number of crisp process inputs. One such process input is product identification, which determines the % amount of open reticle area and, hence, the precise expected correlation between etch bias and BARC OE, as described in connection with FIG. 3.

A second process input is the average DICD of the incoming lot to be processed. A third process input is the target FICD for the incoming lot to be processed. A fourth process input is the identity of the individual etch tool to be utilized in the processing.

In the second method step 410, the target bias necessary to convert the incoming DICD into the desired FICD is calculated according to a simple formula:

TARGET BIAS=FICD TARGET–DICD LOT AVERAGE

The third step 420 in the method 400 calls for determination of the amount of BARC overetching necessary to obtain the target bias. This step requires reference to an appropriate curve determined from the product identity input variable, as shown and described above in conjunction with FIG. 3.

The fourth step 430 in the method 400 calls for etching in accordance with the above-described parameters, with the etch bias manually adjusted to achieve the necessary BARC overetching, as calculated in step 420 above.

In the fifth method step 440, the final inspect critical dimension actually resulting from the above processing steps is measured. The FICD measurement obtained in step 440 is then fed back to control the polysilicon etching process through first feedback loop 445.

In step 450, these FICD results are plotted and interpreted according to tenets of SPC. Then, based upon the operator's interpretation of the variation in results plotted in step 450 and the application of SPC rules 455, in step 460 the graph of FIG. 3 is adjusted for the next calculation of required etch bias necessary to convert the DICD to the desired FICD.

In a method in accordance with the present invention, semiconductor processing variation is controlled utilizing a fuzzy-controlled learning feedback system. A general introduction to this concept is first presented below. Application of this concept to the specific polysilicon etching process of FIGS. 2A–2G is then described.

1. FUZZY LOGIC IN GENERAL

Fuzzy logic theory is mathematical in nature, wherein the term "fuzzy" implies an amount of uncertainty. "Fuzziness" is the uncertainty that is introduced by the interpretation of ambiguous linguistic phrases such as "old car," "high building," and "bright light."

An analogous treatment of uncertainty is found in the study of probability, which attempts to understand and predict randomness. Unlike randomness, however, the uncertainty of fuzziness cannot be relieved with the passage of time. If a guess is made as to the outcome of a random roll of dice, the guess can be verified as soon as the dice are rolled. However, the ambiguity of the phrase "bright light" lies in the relative nature of the adjective, "bright," and no passage of time can resolve such uncertainty.

2. FUZZY SYSTEMS

A fuzzy system is a nonlinear model, the behavior of which is described by a set of humanly understandable statements describing a relationship between various system inputs and a system output. Examples of such relationships include:

IF inside-temperature is cold THEN heater is on-high

IF outside-temperature is high AND humidity is low THEN lawn-sprinkler is on-full Statements appearing before the THEN are "antecedents" or "causes." Statements following the THEN are "consequences" or "effects." To represent the complete functional relationship between inputs and outputs, a collection of rules (the fuzzy rule base) is employed.

There are, in general, three classifications of fuzzy systems: pure fuzzy systems, Takagi and Sugeno's fuzzy system, and fuzzy systems with fuzzifier and defuzzifier. The following description is directed to fuzzy systems with fuzzifier and defuzzifier, although the present invention is not limited to this type of system.

Figure 5A:
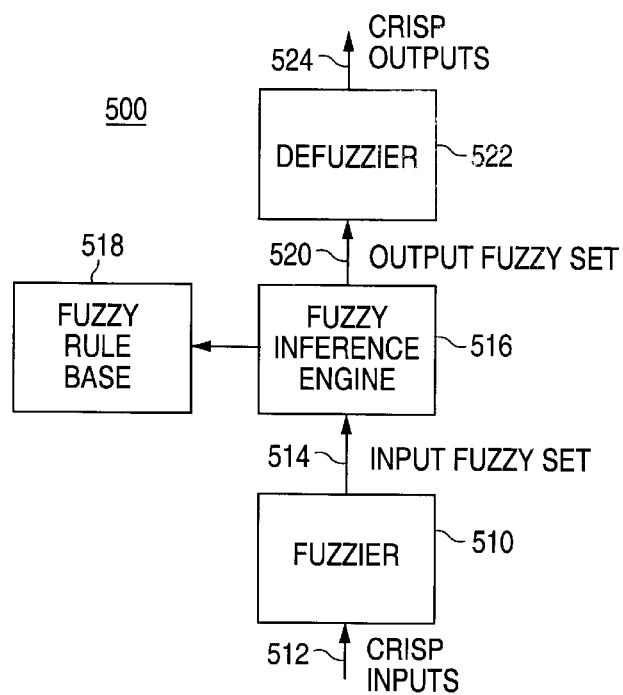
FIG. 5A is a flow chart illustrating a generic view of a method for process control utilizing a fuzzy logic approach.

The basic configuration of a fuzzy system 500 with fuzzifier and defuzzifier is shown in FIG. 5A. Fuzzy system 500 includes fuzzifier 510 receiving crisp, numerical inputs 512. Fuzzifier 510 maps these crisp inputs 512 into fuzzy input sets 514 defined in terms of membership function. Fuzzy input sets 514 are then input to fuzzy inference engine 516. Fuzzy inference engine 516 applies the conditions described in fuzzy rule base 518 and then produces output fuzzy sets 520 also defined in terms of membership function. Defuzzifier 522 receives these output fuzzy sets 520 from inference engine 516 and then converts output fuzzy sets 520 into, crisp outputs 524. The parameters of the semiconductor fabrication process are then adjusted according to the crisp outputs 524 in order to achieve a minimum of process variation.

At the heart of fuzzy system 500 lies the collection of fuzzy IF-THEN rules known as fuzzy rule base 518. Fuzzy rule base 518 allows fuzzy inference engine 516 to determine a mapping from input fuzzy sets 514 in the input space to output fuzzy sets 520 in the output space.

3. FUZZY SETS AND FUZZIFICATION

Fuzzy sets are utilized to represent the imprecision found in natural language. A fuzzy set seeks to quantify imprecise linguistic descriptions of quantities such as tall, small, cold, and bright.

More specifically, a fuzzy set mathematically describes a linguistic variable over a universe of discourse (domain) through a corresponding membership function of the fuzzy set. A linguistic variable is one that involves the previously-mentioned ambiguity of interpretation, such as "old," "fast," and, "bright." Linguistic variables can have either linguistic or numeric values. For example, the linguistic variable "human age" can take "young," "medium," and, "old" as its linguistic value. It can also take on any real number between the approximate limits of zero and one hundred as its numerical value. Other examples of linguistic variables are speed, height, distance, time, and temperature.

A mathematical description of a fuzzy set A is given in Equation 2 below, where X is the range of the membership function and is continuous in nature:

$A=\mu_A(x): X \to [0,1]$, where:

A=fuzzy set
$\mu_A(x)$=membership function
X=range of membership function
x=one particular member Viewed as an extension to Boolean logic, the membership function $\mu_A(x)$ represents the degree of membership of one particular member x belonging to the fuzzy set A. Fuzzy logic, thus, differs from Boolean logic in that it allows more than two sets to describe a given variable. Moreover, the membership functions describing these sets are not discrete, e.g., OFF or ON. In addition to the Boolean states of OFF and ON, fuzzy logic considers in-between states such as SLIGHTLY-OFF and SLIGHTLY-ON, and MOSTLY-OFF and MOSTLY-ON. These concepts are best understood through an example.

Figure 5B:
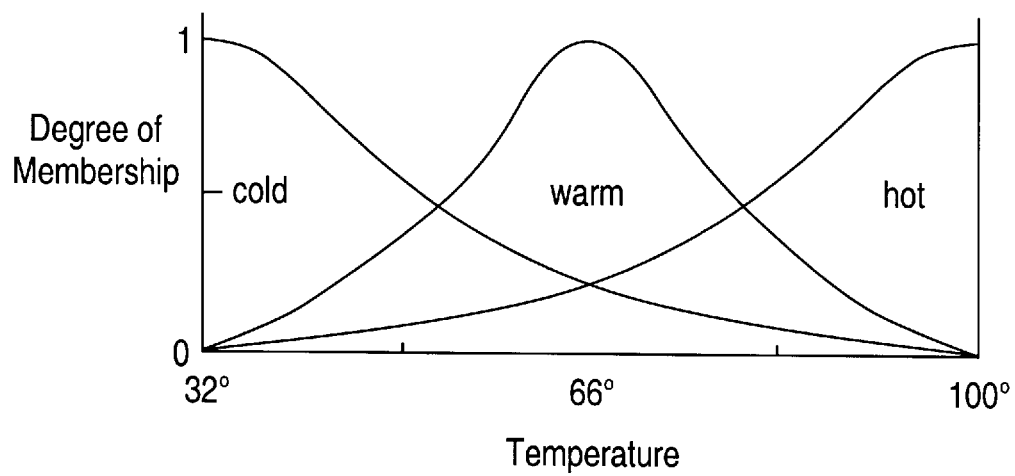
FIG. 5B shows a fuzzy set corresponding to the linguistic variable temperature.

Consider the linguistic variable temperature, which can be described by many different adjectives, each with its own fuzzy set. A typical partition of the domain of the linguistic variable temperature is 32–100° F., as shown in FIG. 5B. Three fuzzy sets, "cold," "warm," and, "hot," are characterized by their corresponding membership functions. The crisp input of 66° F. has a degree of membership of about 0.25 for both the "cold" and "hot" fuzzy sets, $\mu_{cold}(66°$ F.$)=\mu_{hot}(66°$ F.$)=0.25$, and a degree of membership of 1.0 for the "warm" fuzzy set, $\mu_{warm}(66°$ F.$)=1.0$.

The relative nature of a fuzzy set is important, as different people could have very different definitions of what is "hot" and "cold". This ambiguity is inherent in the nature of language and demonstrates how the definition of a fuzzy set is specific to both the application and the user.

Returning to FIG. 5A, the first step of generic fuzzy system 500 is to convert crisp inputs 512 expressed in discrete values into corresponding fuzzy sets expressed in degrees of membership. The simplest form of fuzzification allows an expert familiar with the behavior of the system to select widths and centers of input fuzzy sets 514.

Figure 5C:
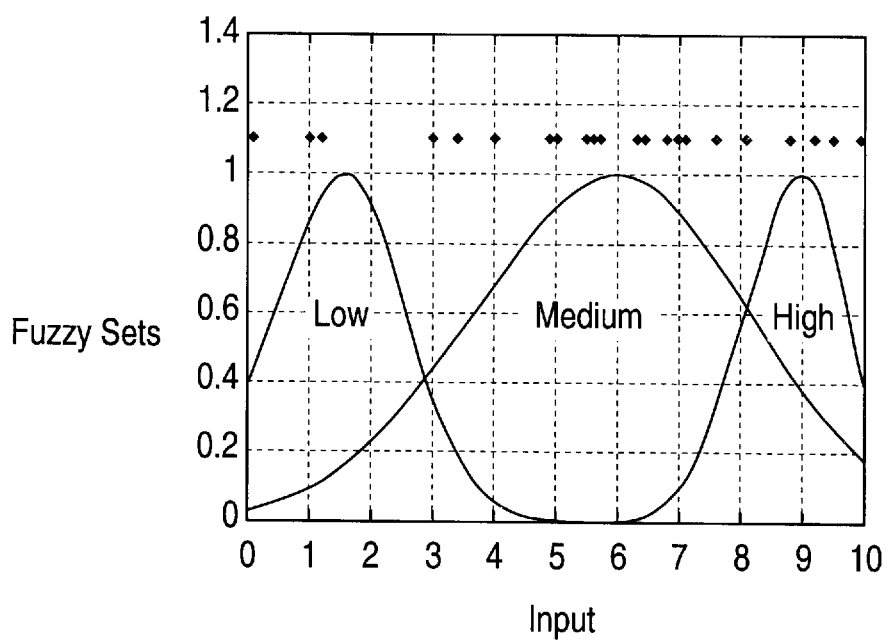
FIG. 5C shows a generic example of fuzzification of a crisp input.

An example of the fuzzification process is shown in FIG. 5C. The crisp input variable has a universe of discourse of 0–10. Twenty-three training samples x and the resultant fuzzy sets produced by the fuzzifier are the K=3 Gaussian-shaped curves. In this example, three fuzzy sets are assigned, corresponding to low, medium, and high.

4. THE FUZZY INTERFACE ENGINE AND FUZZY OPERATORS

As stated briefly above, the role of the fuzzy inference engine is to determine a mapping from input fuzzy sets in the input space to output fuzzy sets in the output space. This is done by applying fuzzy operators.

The logical operations of AND and OR satisfy the laws of Boolean logic, which operate on numeric values of either 0 or 1. However, these operations cannot treat ambiguous, in-between states frequently arising in the real world. Fuzzy logic treats ambiguous states with continuous truth-values on the interval [0,1]. Required logical operations of AND and OR are expressed in fuzzy logic as shown in the truth table of Table 1.

TABLE 1

| Input | | Boolean Logic | | Fuzzy Logic | |
|---|---|---|---|---|---|
| A | B | AND(a,b) | OR(a,b) | Fuzzy AND:a∧b | Fuzzy OR: a∨b |
| 0 | 0 | 0 | 0 | min(a,b) | max(a,b) |
| 0 | 1 | 0 | 1 | min(a,b) | max(a,b) |
| 1 | 0 | 0 | 1 | min(a,b) | max(a,b) |
| 1 | 1 | 1 | 1 | min(a,b) | max(a,b) |

Analysis of TABLE 1 provides insight to the fuzzy logic equivalents of the Boolean logic operations. The standard fuzzy AND(a,b) and fuzzy OR(a,b) (denoted a^b and ab, respectively) are the minimum and maximum of the two inputs. This is easily verified by performing the fuzzy operations on Boolean sets, where indeed the Boolean AND(a,b) and Boolean OR(a,b) are the min(a,b) and max(a,b), respectively. The required distinction between Boolean and fuzzy operators is that fuzzy operators are defined on sets with non-discrete membership functions.

5. FUZZY RULE BASE

Fuzzy rule base 518 of FIG. 5A is used to represent the complete functional relationship between the fuzzy input sets 514 and the fuzzy output sets 520 of the fuzzy system 500. Fuzzy rule base 518 is the heart of fuzzy system 500 in the sense that all other system components (fuzzy sets) are used to interpret these rules.

The two most common methods for determining the IF-THEN rules making up the fuzzy rule base are to ask human experts, and to use training algorithms based on empirical data. Fuzzy rule base 518 provides a framework for human experts to express their accumulated knowledge of the operational characteristics of a system.

Fuzzy inference engine 516 uses fuzzy logic principles to interpret fuzzy IF-THEN rules of fuzzy rule base 518 and thereby map fuzzy input sets 514 to fuzzy output sets 520. The standard fuzzy interpretation of an IF-THEN rule is best explained by considering the following fuzzy rule, in which output fuzzy set C is implied from fuzzy input sets A and B:

IF A and B, THEN C

The fuzzy inference engine, when applied to this rule, results in a mapping as given by Equation 3.

$$\mu C(x,y)=\min\{\mu_A(x),\mu_B(y)\} \qquad (3)$$

In the general case, fuzzy set Z may be implied by a multitude of fuzzy rules.

IF (A and B) or (C and D) or ... or (K and L), THEN Z $$\mu_Z(v,w,x,y)=\max\{\min\{\mu_A(v),\mu_B(w)\},\ldots,\min\{\mu_K(x),\mu_L(y)\}\} \qquad (4)$$

The mapping of Equation 4 is known as the max-min fuzzy inference engine and is the method most commonly used today. The max-min fuzzy inference engine is the fuzzy logic counterpart of the Boolean sum-of-products functional description technique, where "min" is the fuzzy AND that replaces products and "max" is the fuzzy OR that replaces sum. A traditional Boolean logical function can be expressed as a "sum-of-products" expression. In a sum-of-products, an output variable is expressed as a function in which individual rule antecedents are ANDed together (signified in Boolean algebra with a multiplication signal); these ANDed conglomerates can then be logically ORed (which uses an addition symbol). The resulting expression is equivalent to a fuzzy inference engine's final max-min statement.

6. DEFUZZIFICATION

Defuzzification is the process of mapping the degrees of membership of the output fuzzy sets back to a crisp output variable for real-world interpretation. There are many different defuzzification techniques. The two most common approaches are the center of gravity or center average method and the modified center average method, as given by Equation 5 and Equation 6, respectively, below:

$$y(x) = \frac{\sum_i c_i \mu_i(x)}{\sum_i \mu_i(x)}, \text{ for } i = 1, 2, \ldots, M \quad (5)$$

$$y(x) = \frac{\sum_i \frac{c_i}{\sigma_i} \mu_i(x)}{\sum_i \frac{\mu_i(x)}{\sigma_i}}, \text{ for } i = 1, 2, \ldots, M \quad (6)$$

M is the total number of output fuzzy sets, and $c_i$ and $\sigma_i$ are the center and width of the $i^{th}$ output membership function, respectively.

Figure 5D:
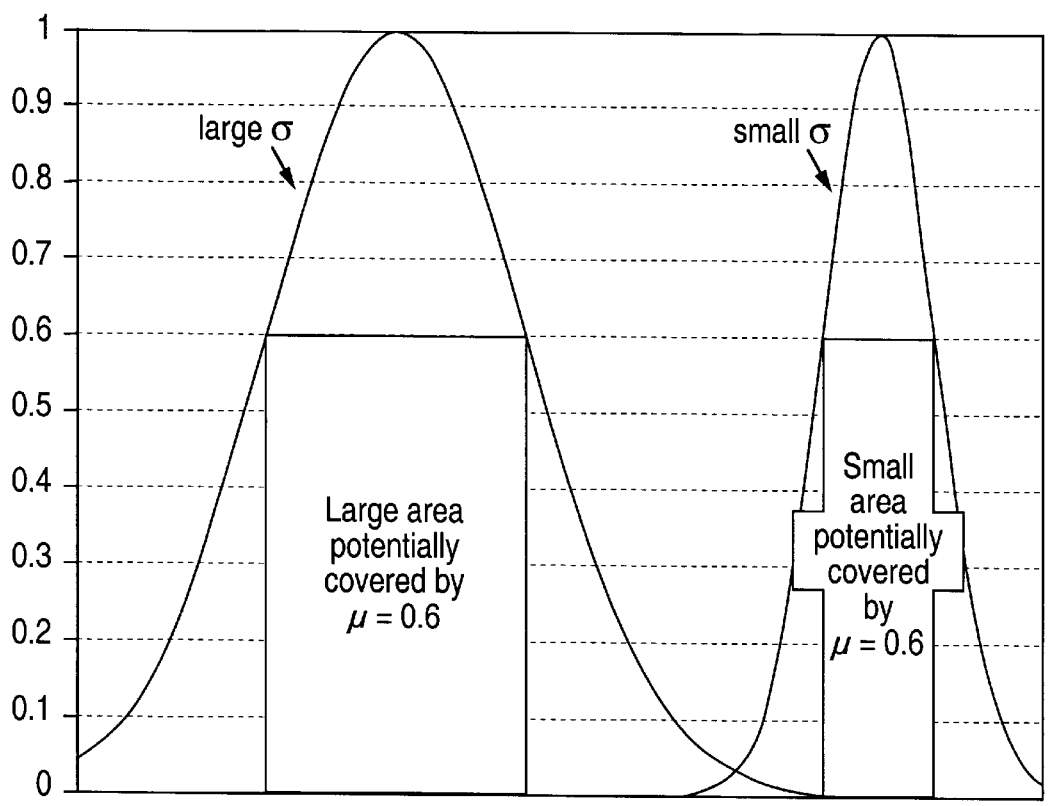
FIG. 5D shows the potential range of crisp values for wide fuzzy sets and narrow fuzzy sets.

The center average defuzzifier shown in Equation 5 is a weighted average of the center and degree of membership of each fuzzy set. The center average defuzzification approach is generally not acceptable because it fails to consider the width of the membership function. Common sense approach indicates that the degree of membership of a particular fuzzy output set is near a value of one, then the sharper the shape of the membership function, the stronger is the belief that the crisp output should be near the center of that particular membership function. FIG. 5D shows that the potential range of crisp values with at least a given membership within a fuzzy set is larger when the set is wide and smaller when the set is narrow. The smaller set is, therefore, more strongly indicative of the center value.

Such use of membership function width is the purpose of the modified center average defuzzifier and is nearly always preferable. If the widths of all membership functions are the same, then the center average and modified center average defuzzifier methods are equivalent.

7. THE DELTA RULE LEARNING METHOD AND CONSIDERATIONS FOR BATCH PROCESS CONTROL

Several theories exist in neural network theory to represent means of learning, or extracting information from a data set. One of the most important of these is Widrow and Hoff's Delta Rule, which forms the foundation of the common Back-Propagation learning method. The Delta Rule is based on a gradient descent method for iteratively optimizing a linear equation, $$\Delta = wx + b$$

where w indicates the coefficient of the equation, x indicates an input parameter, and b indicates some scalar bias, such that for each available data point, the difference between the output of the equation $\Delta$ and the real value y is used to update the coefficient per the Delta rule equation $$\Delta = w_{n+1} = w_n + \eta(y - \Delta)$$

where $w_{n+1}$ indicates a new coefficient, $w_n$ indicates a current coefficient, and $\eta$ is called the "learning rate" and can range from 0 to 1, but is generally a very small value (in the vicinity of 0.1).

The Delta Rule method is effective when used to iterate repeatedly through a large available data set, however, this method works poorly within the constraints of a batch-based process such as semiconductor manufacturing. In a dynamic environment, it is important that the learning rate be variable so that learning begins when a process becomes unstable and terminates when outputs return to controlled conditions. It is also important that the learning rate be large so that deviations can be controlled quickly. Using a dynamically generated learning rate from a fuzzy inference engine is an effective and robust means of achieving this result.

8. APPLICATION OF FUZZY-CONTROLLED LEARNING FEEDBACK TO POLYSILICON ETCH PROCESS

Figure 6:
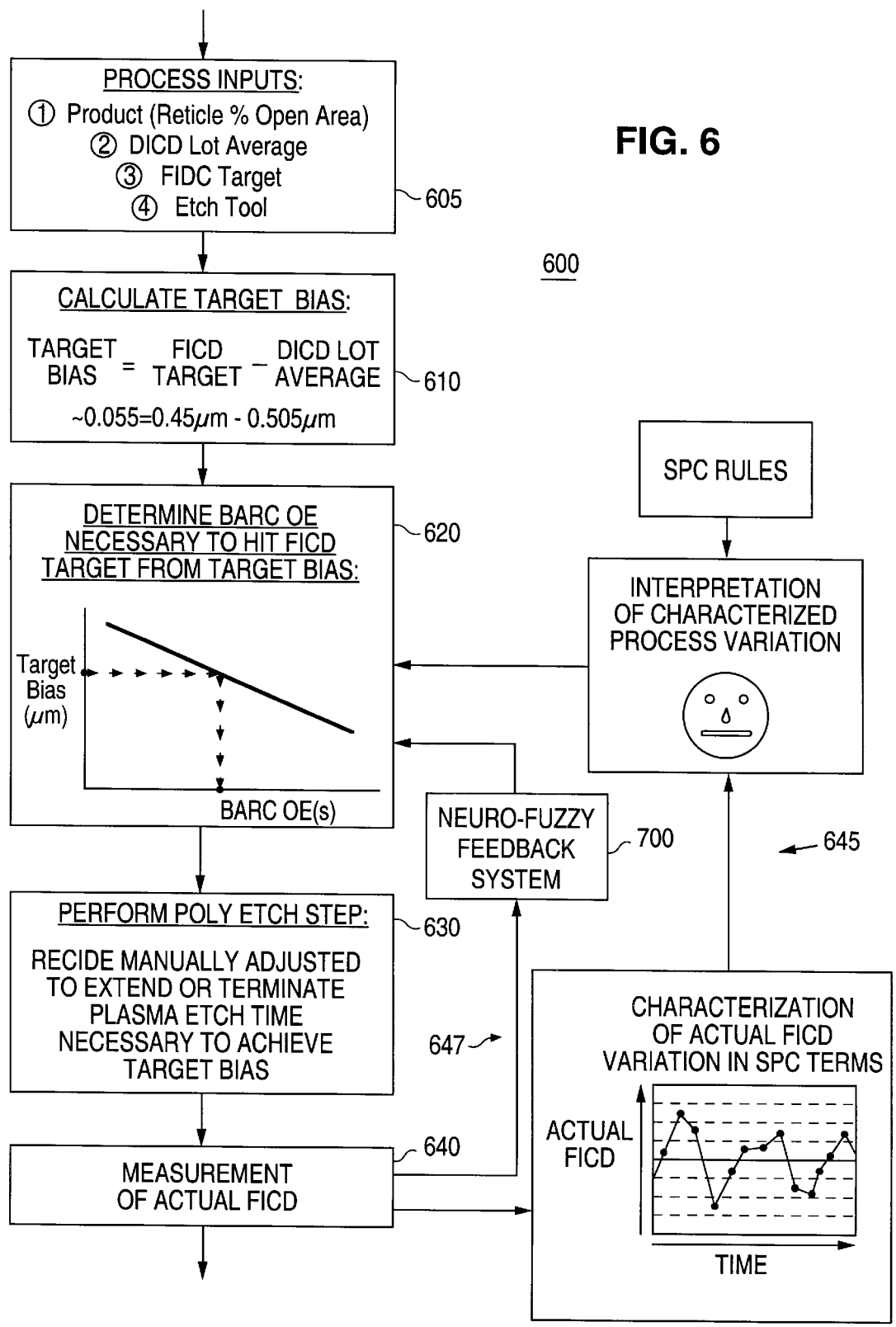
FIG. 6 is a flow chart illustrating a method in accordance with one embodiment of the present invention for implementing the polysilicon etch sequence shown above in FIGS. 2A–2G.

FIG. 6 shows one embodiment of a method in accordance with the present invention for controlling variation in the polysilicon etching process discussed above in conjunction with FIGS. 2A–2G.

As a first step 605, method 600 receives a number of crisp process inputs. One such process input variable is product identification, which determines the percentage amount of open reticle area and hence the precise expected correlation between etch bias and BARC OE, as described in connection with FIG. 3.

A second process input is the average DICD of the incoming lot to be processed. A third process input is the target FICD for the incoming lot to be processed. A fourth process input is the identity of the individual plasma etching tool to be utilized in the processing.

In the second method step 610, the target bias necessary to convert the incoming DICD into the desired FICD is calculated according to a simple formula:

TARGET BIAS=FICD TARGET−DICD LOT AVERAGE

The third step 620 of method 600 calls for determination of the amount of BARC overetching necessary to obtain the target bias. This step requires reference to an appropriate curve as determined from the product identity input variable, as shown and described in detail above in conjunction with FIG. 3.

The fourth method step 630 calls for etching in accordance with the above-described parameters, with etch bias automatically adjusted to achieve the BARC overetching as calculated in step 620 above.

In the fifth method step 640, the final inspect critical dimension actually resulting from the above processing steps is measured. The FICD measurement obtained in step 640 is then fed back to control the polysilicon etching process through first feedback loop 645 in parallel with second feedback loop 647.

First feedback loop 645 essentially duplicates the conventional feedback methodology described in conjunction with FIG. 4. Actual FICD data is collected and characterized utilizing SPC principles. Significant variation in actual FICD, for example FICD which varies outside of designated control limits, results in human intervention and gross adjustment of process parameters.

Second feedback loop 647 utilizes a fuzzy system to recognize smaller variations in FICD and to make finer adjustments in the polysilicon etching parameters.

Figure 7:
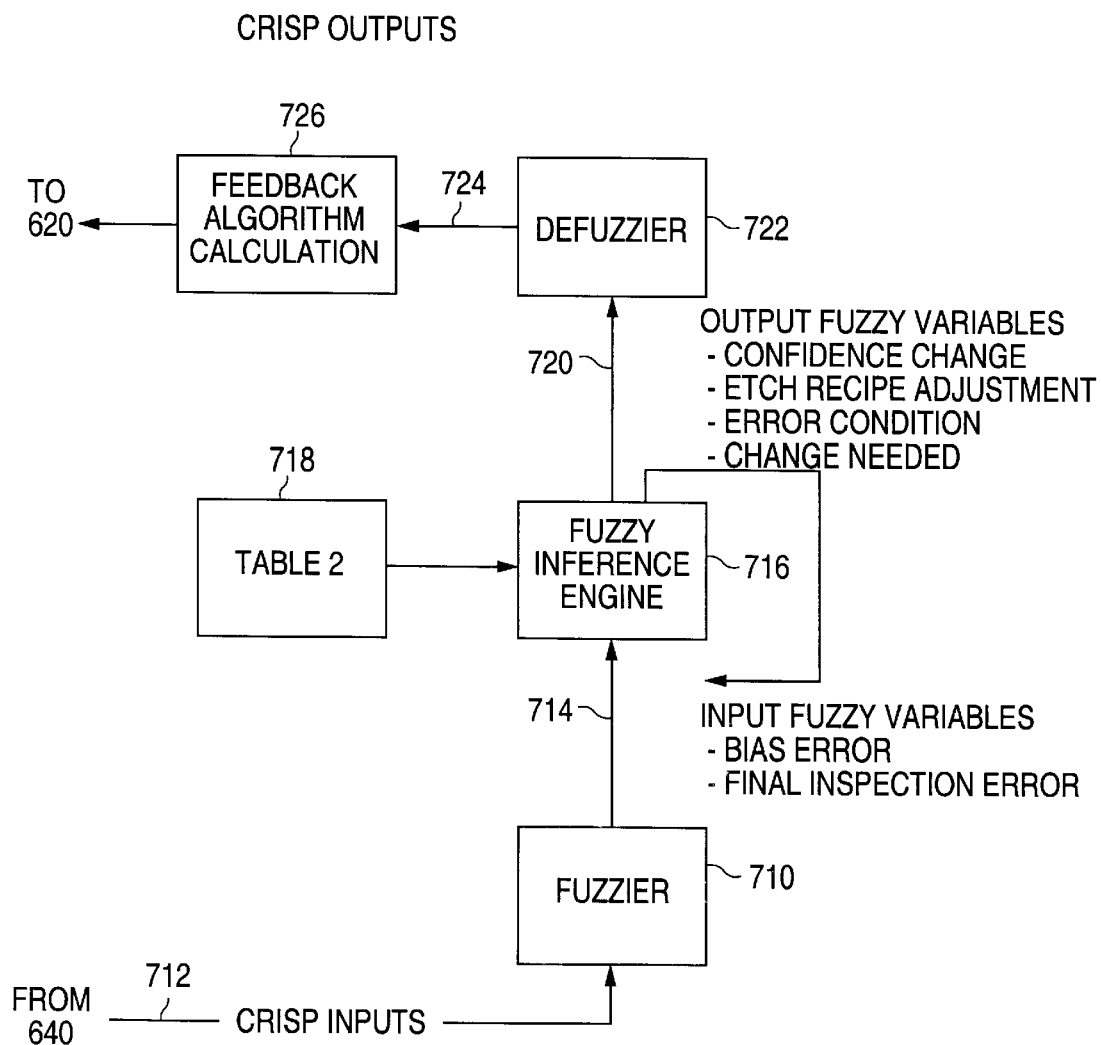
FIG. 7 shows a detailed view of the fuzzy logic feedback analysis performed in the method shown in FIG. 6.

Second feedback loop 647 is shown in detail in FIG. 7. Fuzzy system 700 receives as inputs two crisp results from the process flow. The first crisp input is Bias Error, which represents errors in the ability of the feedforward controller to model the current process conditions. To more accurately represent feedforward model error versus unavoidable noise in the process, Bias Error uses a weighted moving average window of the most recent three lots in a given bin:

$$\text{Bias Error} = \frac{0.8 \cdot \text{BiasE}_{i-2} + \text{BiasE}_{i-1} + 1.2 \cdot \text{BiasE}_{i=0}}{3}$$

In addition, Bias Error is compensated for short-term tweak suggestions the engine makes, should those suggestions be employed in an attempt to smooth system response.

Figure 8A:
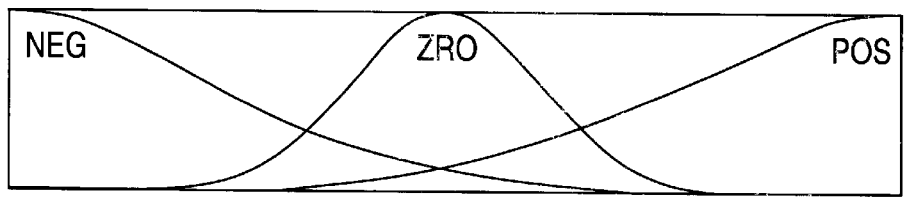
FIG. 8A shows the fuzzy sets for the bias error input variable to the process control method of FIG. 7.

During the process of fuzzification by fuzzifier 710, the Bias Error input variable is transformed into a fuzzy variable with three fuzzy sets: NEGATIVE (NEG), ZERO (ZRO), and POSITIVE (POS), as shown in FIG. 8A. Since tight bias control will lead to a more consistent output, this part of the fuzzy system was designed with the intent of reducing bias error as much as possible.

A second crisp input variable is FICD Error. FICD Error represents the actual amount of deviation of the polysilicon gate width from the target. This variable uses a weighted moving average of only the last two lots, and does not filter any engine effects from its calculation, in an effort to represent process behavior rather than model behavior. This modification serves two purposes. First, if gate width is staying within close range of target values even though there seems to be an error in the feedforward model, rules will be employed to slow learning. However, since this variable represents only two lots' data, it will respond more quickly to a process shift than the Bias Error and tend to induce learning slightly earlier in the event that gate width deviates from target.

Figure 8B:
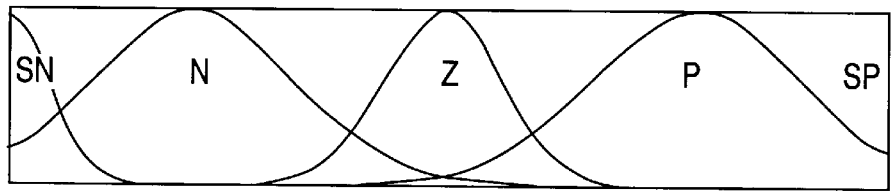
FIG. 8B shows the fuzzy sets for the final inspection critical dimension error input variable to the process control method of FIG. 7.

During the process of fuzzification by fuzzifier 710, the FICD Error input variable is mapped into five fuzzy input sets. This is shown in FIG. 8B. Since FICD Error represents the final output of the polysilicon etch process, it is desirable to produce an error-correcting behavior when this FICD input variable goes out of control limits. Thus, the STRONG NEGATIVE (SN) and STRONG POSITIVE (SP) fuzzy sets represent variation of the process out of control limits. The remaining three fuzzy sets NEGATIVE (N), ZERO (Z), and POSITIVE (P) correspond to negative, zero, and positive FICD error, respectively. The intermediate fuzzy sets N, Z, and P represent FICD variation requiring correction, but not serious enough to flag as violating control limits.

Fuzzy-controlled learning system 700 then utilizes fuzzy inference engine 716 to apply fuzzy rule base 718 to the above input fuzzy variables 714 in order to produce output fuzzy variables 720.

Four variables are output by fuzzy system 700. The first output variable of fuzzy system 700 is "Change Needed?".

Figure 9A:
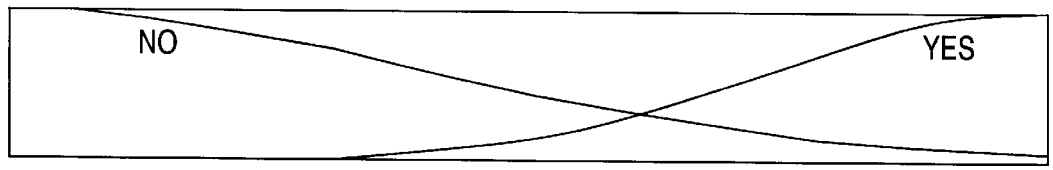
FIG. 9A shows the fuzzy sets for the change needed output variable of the process control method of FIG. 7.

The "Change Needed?" variable indicates that the polysilicon etching process may be approaching control limits, and that the operating point should be modified. As shown in FIG. 9A, the Change Needed? output variable is divided into NO and YES fuzzy sets, with the YES fuzzy set narrower than the NO fuzzy set. This configuration causes fuzzy system 700 to avoid responding to the YES fuzzy set over a larger region of operation, but to respond more sharply to a possible needed change condition than to a stable, no-change state. Due to the use of the Weighted Center of Gravity defuzzification method, a narrower output fuzzy set is weighted more heavily when producing a crisp output value. This value is used as a metric of when a change should be effected. Values near 0 indicate normal variation, while values near 1 indicate that corrective action may be required.

A second output variable of fuzzy system 700 is "Etch Recipe Adjustment." The Etch Recipe Adjustment variable serves as an indication of how etching conditions (etch bias) received from the feed-forward algorithm must be changed.

Figure 9B:
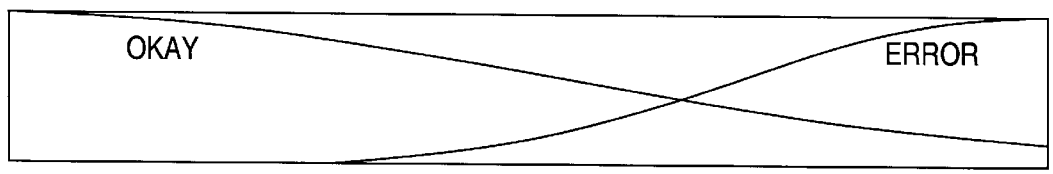
FIG. 9B shows the fuzzy sets for the change in over etch output variable of the process control method of FIG. 5.
Figure 9C:
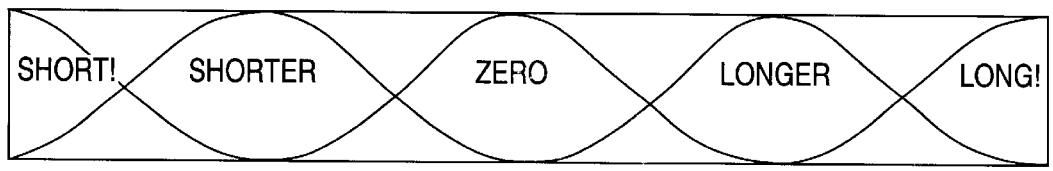
FIG. 9C shows the fuzzy sets for the error condition output variable to the process control method of FIG. 5.

As shown in FIG. 9C, the Etch Recipe Adjustment output variable is divided into SHORT!, SHORTER, ZERO, LONGER, and LONG! fuzzy sets. This provides an instantaneous correction to compensate for variation.

A third output variable of fuzzy system 700 is "Error Condition." The Error Condition variable indicates whether or not the process is approaching or exceeding control limits. As shown in FIG. 9B, the Error Condition variable is mapped into OKAY and ERROR fuzzy sets, with the ERROR fuzzy set narrower than the OKAY fuzzy set. This configuration induces a sharper response to potential error conditions in a manner similar to that of the "change needed" output. This output is intended for feedback to the operators.

Figure 9D:
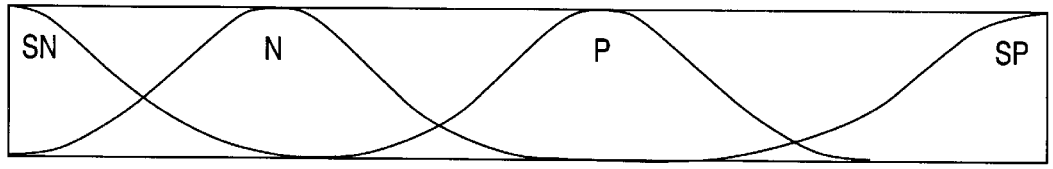
FIG. 9D shows the fuzzy sets for the changed confidence output variable of the process control method of FIG. 5.

A fourth output variable is "Confidence Change." The Confidence Change variable provides an indication as to whether or not the process appears to be following the model well and/or is producing on-target FICD. The Confidence Change output variable is divided into four fuzzy sets: STRONGLY NEGATIVE (SN), NEGATIVE (N), POSITIVE (P), and STRONGLY POSITIVE (SP). The membership functions of these fuzzy sets is shown in FIG. 9D. The goal of fuzzy system 700 is to be constantly adjusting the confidence change output variable either upwards or downwards.

Fuzzy Rule Base 718 of fuzzy system 700 contains 15 rules, and is set in Table 2 below.

TABLE 2

FUZZY RULE BASE

| | INPUTS | | OUTPUTS | | | |
|---|---|---|---|---|---|---|
| Rule No. | Bias Error | FICD Error | Change Needed? | Etch Recipe Adj | Error Condition | Confidence Change |
| 1 | ZRO | Z | N | ZERO | N | — |
| 2 | NEG | P | N | ZERO | N | — |
| 3 | POS | N | N | ZERO | N | — |
| 4 | POS | Z | Y | LONGER | N | — |
| 5 | POS | P | Y | LONGER | N | — |
| 6 | NEG | Z | Y | SHORTER | N | — |
| 7 | NEG | N | Y | SHORTER | N | — |
| 8 | — | SP | Y | LONG! | Y | — |
| 9 | — | SN | Y | SHORT! | Y | — |
| 10 | NEG | — | — | — | — | SN |
| 11 | POS | — | — | — | — | SN |
| 12 | ZRO | SN | — | — | — | N |
| 13 | ZRO | SP | — | — | — | N |
| 14 | ZRO | — | — | — | — | SP |
| 15 | — | Z | — | — | — | P |

The rule base of TABLE 2 is the product of several iterations of development. In the first iteration, a process engineer designed the rule base on a case-by-case basis. In the second iteration, a more formalized approach was applied to generate a more systematically consistent rule base, and the rule base was then simplified by removing less orthogonal rules. The rule base was fine-tuned through manual interaction with numerous simulations, testing various response methods, and concluding with a formal design of experiment and simulation across most anticipated control situations.

An example of application of the fuzzy rule base of TABLE 2 is as follows. The fuzzy rule number one reads: "If Bias Error is Zero and FICD Error is Zero, then "Change Needed?" is No, adjustment of the etch recipe is Zero, no Error Condition is indicated, and Confidence remains unaffected". As another example, penultimate fuzzy rule number fourteen reads: "If Bias Error is Zero then Confidence Change is Strongly Positive."

Output fuzzy variables 720 are sent through the defuzzifier 722 resulting in crisp outputs 724. Crisp output Confidence Change is used to calculate the variable CONFIDENCE in the Delta Rule equation. The NEW INTERCEPT, $b_{n+1}$, to be used in calculating the amount of BARC overetching the Delta Rule calculation 726 is completed by combining the value for CONFIDENCE with a constant η, crisp input BIAS ERROR, and the current intercept b. The result of the Delta Rule calculation is the NEW INTERCEPT, $b_{n+1}$, that is used in calculating the amount of BARC overetching for the next process run 620.

Externally to the fuzzy component of the learning system, a "confidence" value is maintained; this variable is used to adjust the confidence value, which is allowed to range from 0 to 1. Confidence change values that exceed the range's lower or upper boundaries are clipped to 0 or to 1, respectively. This value is supplied to a modified version of the Delta Rule algorithm, and is used to modify the learning rate in a dynamic fashion. This Delta Rule equation is the feedback component of this control mechanism.

The feedback algorithm computation is a two-part process. First, new data is added to the moving averages and the resulting values are sent through fuzzy inference engine 716. The outputs of the engine are then used in the following Delta Rule equation $$b_{n+1} = b_n + (1 - \text{Confidence}) \cdot \eta \cdot \text{BiasError},$$

where:

$b_n$ = intercept at the present time $b_{n+1}$ = new intercept

Confidence = system confidence after evaluation of the fuzzy engine

η = user-specified learning rate (tuned experimentally to the value 0.575)

BiasError = input variable.

Crisp output Change Needed is used to prevent overcorrection by comparing its value to a threshold value. If the Change Needed value is less than the threshold, then do not apply the output from the Delta Rule and keep the current intercept $b_n$. If Change Need value is greater than or equal to the threshold, then apply the Delta Rule result $b_{n+1}$.

Crisp Output Etch Recipe Adjustment could be useful in cases that require instantaneous correction. For this application, learning is adequate. The Error Condition output provides an advisory reference value for operators and is not used in any calculations.

Figure 10:
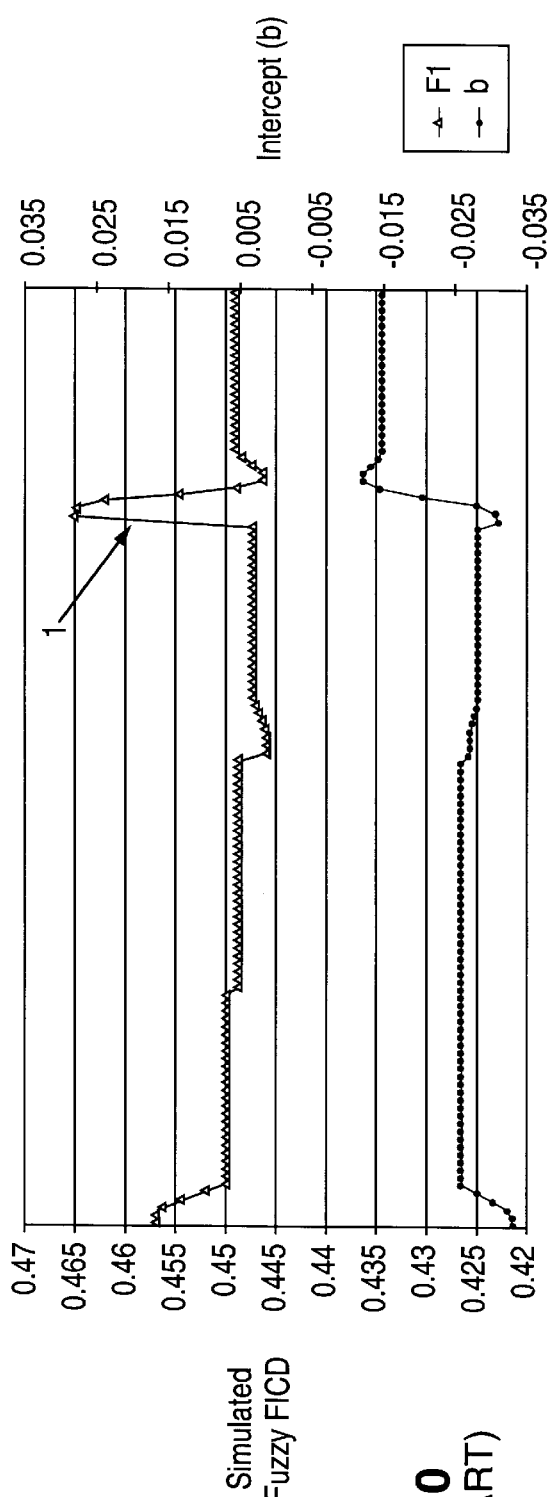
FIG. 10 plots FICD and y-intercept versus lot number for a simulated correction of process variation utilizing a conventional SPC analysis.

Simulated lot-to-lot variation in polysilicon etching evidences the superiority in reduction of process variation utilizing the present invention. FIG. 10 plots FICD and y-intercept versus lot number for a simulated correction of process variation utilizing a conventional SPC analysis. FIG. 10 shows that at point 1, the polysilicon etching process experiences a variation that raises the FICD. This variation is corrected by altering the y-intercept (b) of the etch bias/BARC OE plot.

Figure 11:
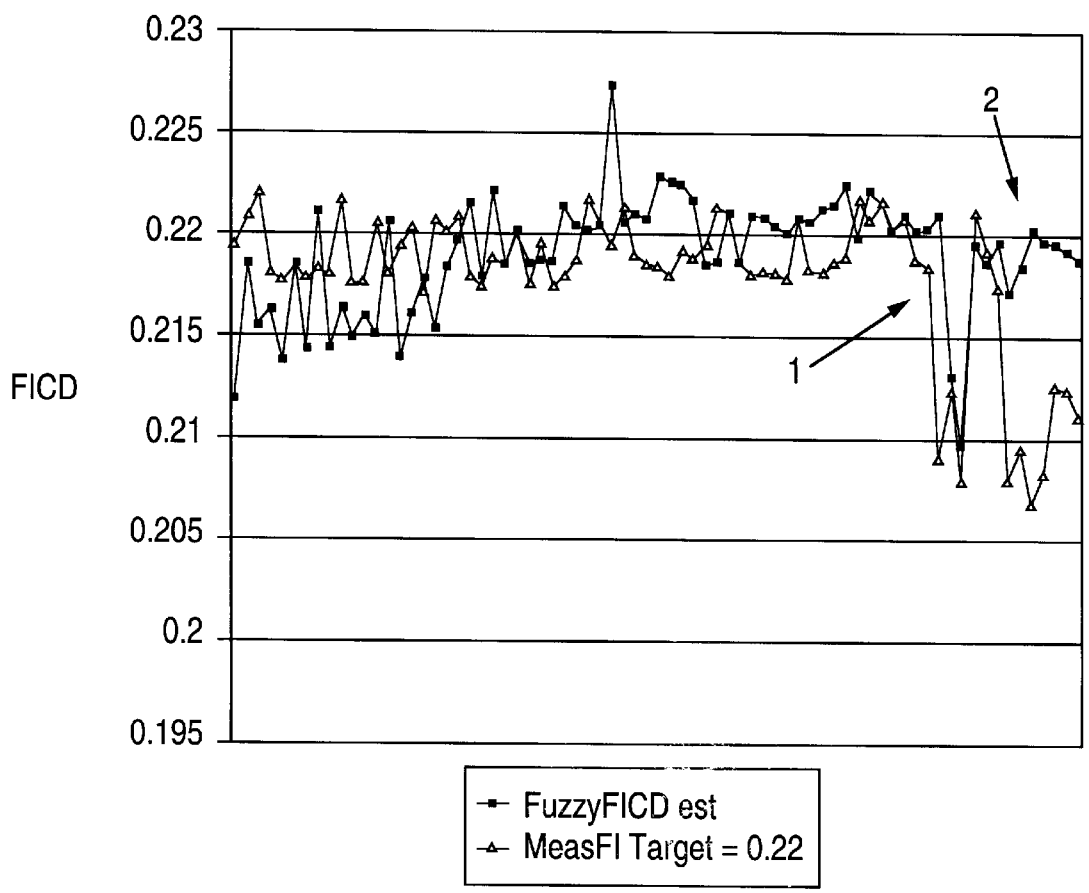
FIG. 11 plots FICD versus lot number for a simulated correction of process variation utilizing a fuzzy system in accordance with one embodiment of the present invention.

FIG. 11 plots FICD versus lot number for a simulated correction of process variation utilizing a fuzzy system in accordance with one embodiment of the present invention. The target FICD is 0.22, but a disturbance in process variation occurs at point 1, such that the actual FICD drops precipitously. The second line plots the simulated correction of this variation, such that by point 2 the FICD has largely returned to the 0.22 target value. However, at point 2 the actual FICD remains well below the target, and would require manual intervention to correct.

Figure 12:
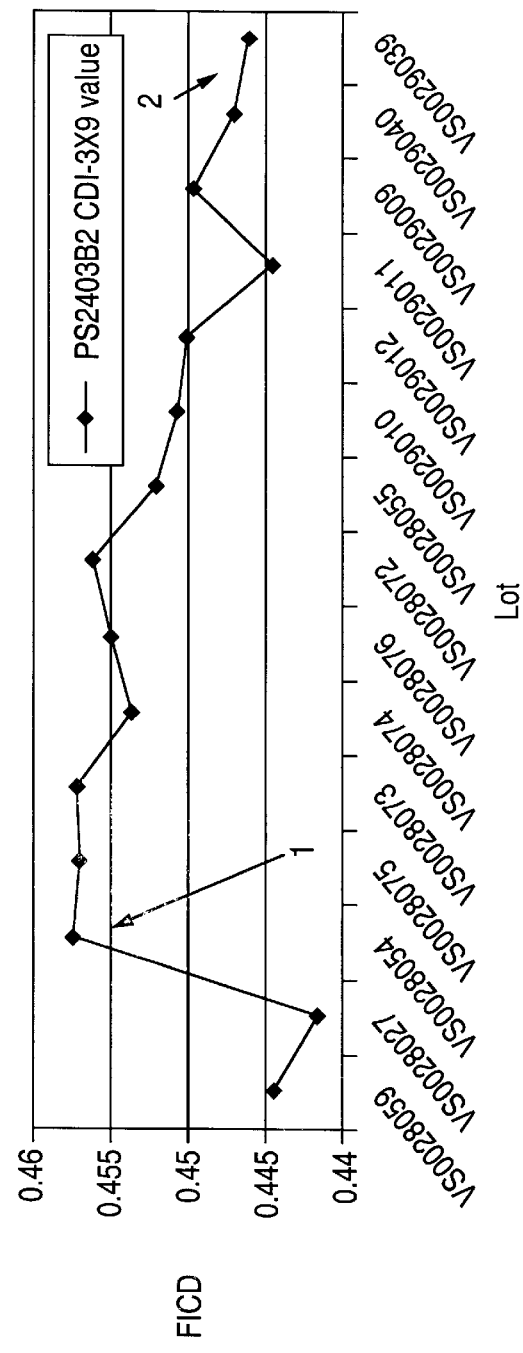
FIG. 12 plots FICD versus lot number for actual production use of the Fuzzy-Controlled learning Feedback application to an intentional disturbance of polysilicon etching process parameters.

FIG. 12 shows actual production use of the Fuzzy-Controlled learning Feedback application to an intentional disturbance of polysilicon etching process parameters. At point 1 the process is intentionally skewed to produce an FICD approximately 7 nanometers above target. The fuzzy system then intervenes and begins to learn of the variation, gradually returning the FICD to the target. By point 2, the system has returned to 100% confidence as learning ends.

9. ADVANTAGES REALIZED FROM APPLICATION OF FUZZY-CONTROLLED LEARNING FEEDBACK TO POLYSILICON ETCH PROCESS

The method of controlling semiconductor processing in accordance with the present invention offers a number of important advantages over conventional methods.

One advantage is a substantial improvement in the time of response to variation. Because process results are electronically fed directly to the fuzzy system, the fuzzy system may respond almost instantaneously to any recognized trend in process variation. The corresponding reduction in lag time between process variation recognition of process trends alleviates the loss of materials and effort encountered in the conventional method as products fall out of specified tolerances before the variation can be recognized and corrected.

Figure 13A:
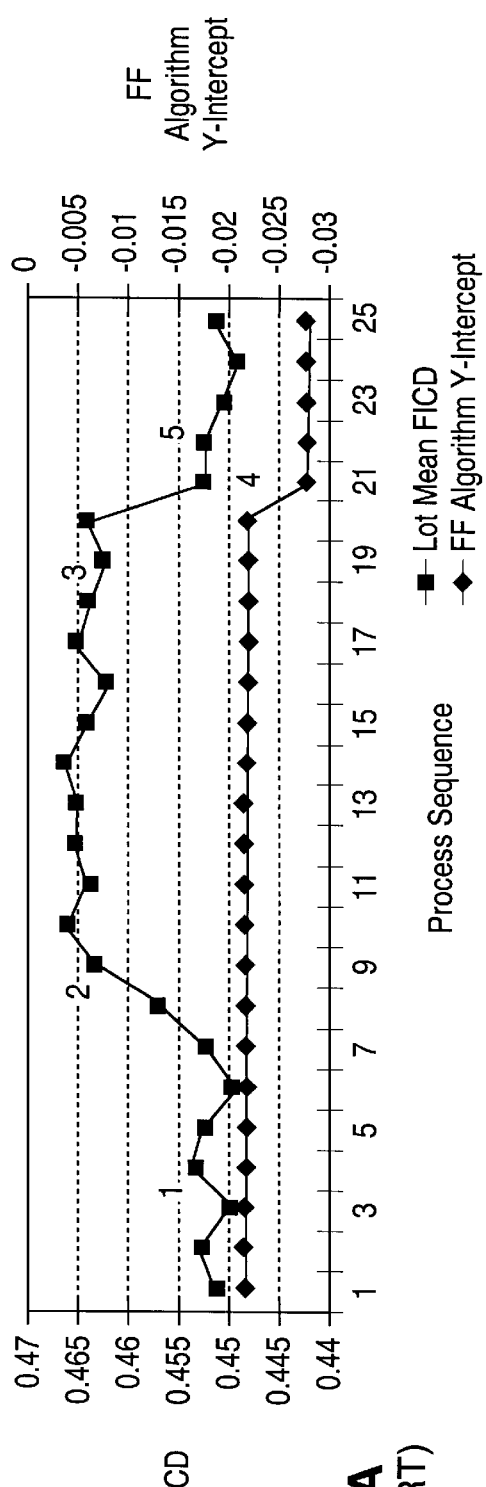
FIG. 13A depicts the concept of FICD variation reduction resulting from the polysilicon etch process utilizing conventional manual SPC intervention.
Figure 13B:
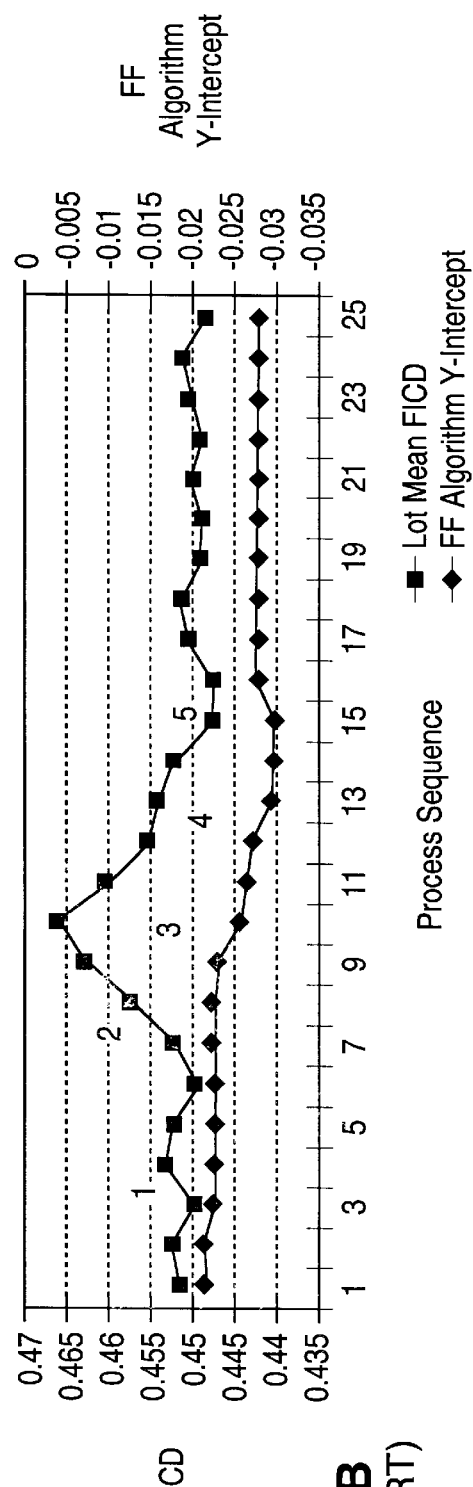
FIG. 13B depicts the concept of FICD variation reduction resulting from the polysilicon etch process utilizing a fuzzy logic system in accordance with one embodiment of the present invention.

This advantage is evident in the concept data shown in FIGS. 13A–13B. FIG. 13A depicts reduction in variation in FICD resulting from the polysilicon etch process utilizing conventional manual SPC intervention. At point 1, the FICD measurement is stable and within control limits. At point 2, variation causes an upward shift in FICD. Much later, at point 3, the human operator recognizes and reacts to the upward trend in FICD, and the etch bias/BARC OE curve is adjusted to compensate for this variation. At point 4, the FICD is returned to target and is stable.

By contrast, FIG. 13B depicts reduction in variation in FICD resulting from the polysilicon etch process utilizing a fuzzy logic system in accordance with one embodiment of the present invention. At point 1, the FICD measurement is stable and within control limits. At point 2, variation causes an upward shift in FICD. Almost immediately thereafter, the fuzzy feedback controller recognizes the FICD shift and begins to react. By point 3, FICD's are returned to target automatically over the next few runs without human judgment or manual intervention. Due to an absence of lag time in recognizing variation by the human operator, the response time is cut almost in half, with a corresponding savings in material and products.

Another important advantage is that the extent of human intervention into the process to correct variation is kept to a minimum. Specifically, data from the fabrication process is automatically fed to the fuzzy system, which then automatically characterizes any variation and; then acts upon this variation to adjust relevant process parameters. No human, intervention is required for this feedback mechanism to take place.

Yet another advantage of the method in accordance with the present invention is the predictability and reproducibility of alteration of process parameters in the face of a given trend in process variation. Because the fuzzification and subsequent fuzzy logic processes are automatically performed according to a fixed set of rules, the method will respond in the same manner to a given degree of process variation with little or no variation attributable to differences of the individual operator.

Although the present invention has so far been described in connection with one specific embodiment, the invention should not be limited to this particular embodiment. Various modifications and alterations in the method will be apparent to those skilled in the art without departing from the scope of the present invention.

For example, while FIGS. 6 and 7 describe control over the process parameter of critical dimension during a polysilicon plasma etch sequence, the present invention is not limited to this particular application. Process variation in a variety of other semiconductor techniques could also be controlled in accordance with the present invention. Examples of alternative semiconductor fabrication processes eligible for control in accordance with the present invention include but are not limited to chemical mechanical polish, chemical vapor deposition, and ion-implantation.

Moreover, while the above figures describe control over process variation utilizing a fuzzy system requiring fuzzification and defuzzification, the present invention is not limited to such a system. For example, a pure fuzzy system, or a Takagi and Sugeno's fuzzy system, could also be employed to detect and correct variation in semiconductor processing, and the method would still remain within the scope of the present invention.

Similarly, a process control method could employ alternate techniques for fuzzification and defuzzification, for example the center average, center of area and mean of max methods. In addition, an alternative method could be employed to determine the IF-THEN rules of the fuzzy system, for example utilizing training algorithms based upon empirical data.

Given the above detailed description of the invention and the variety of embodiments described therein, it is intended that, the following claims define the scope of the present invention, and that the structures and processes within the scope of these claims and their equivalents be covered hereby.

What is claimed is:

1. A method of controlling variation in a process utilizing a fuzzy-controlled learning feedback system, the method comprising:
    generating a plurality of crisp process input values related to control of the process, the crisp process input values including at least one crisp process input value related to a specific process parameter value to be controlled;
    determining a target bias value suitable for converting said at least one crisp process value input value to a final process value that results in a desired final specific process parameter value;
    determining an amount of variation needed in a preselected step of the process to obtain the target bias value;
    performing the preselected step of the process in accordance with the determined amount of variation, thereby generating a new at least one crisp process input value;
    processing the new at least one crisp process input value utilizing a fuzzy feedback system to generate an adjustment value;
    utilizing the adjustment value to determine an updated target bias value; and
    utilizing the updated target bias value to iteratively repeat the foregoing recited steps of the process until the desired final specific process parameter value is substantially obtained.

2. A method of controlling variation in a polysilicon etching process utilizing a fuzzy-controlled learning feedback system, the method comprising:
    receiving a plurality of crisp process input variables, including a product identification input variable which determines a precise expected correlation between etch bias and bottom anti-reflective coating over-etch (BARC OE), and further including an average develop inspect critical dimension (DICD) input variable of an incoming wafer lot to be processed and a final inspect critical dimension (FICD) input variable of wafer lots already processed;
    utilizing the DICD input variable and the FICD Target input variable to calculate a target bias value necessary to convert the incoming DICD into the desired FICD Target;
    determining an amount of BARC overetching necessary to obtain the target bias value;
    etching a layer of polysilicon in accordance with the DICD input variable, the FICD Target input variable and the target-bias value;
    measuring the FICD value actually resulting from the preceding etching step;
        feeding the measured FICD value back to a feedback loop that utilizes a fuzzy feedback system to generate at least one fuzzy output variable;
        utilizing the at least one fuzzy output variable to iteratively repeat the foregoing recited steps of the process until the actual FICD value measured on the wafer lot is substantially the same as the FICD Target input variable.

* * * * *